United States Patent [19]

Takahashi

[11] Patent Number: 5,381,356
[45] Date of Patent: Jan. 10, 1995

[54] CASCADE DIGITAL FILTERS FOR REALIZING A TRANSFER FUNCTION OBTAINED BY CASCADE-CONNECTING MOVING AVERAGE FILTERS

[75] Inventor: Yutaka Takahashi, Tokyo, Japan
[73] Assignee: NEC Corporation, Tokyo, Japan
[21] Appl. No.: 27,247
[22] Filed: Mar. 2, 1993
[30] Foreign Application Priority Data
  Mar. 3, 1992 [JP] Japan .................. 4-045085
[51] Int. Cl.$^6$ ............................. G06F 15/31
[52] U.S. Cl. .................. 364/724.17; 364/724.03
[58] Field of Search .............. 364/724.01, 724.17, 364/745, 724.03

[56] References Cited
U.S. PATENT DOCUMENTS

| | | | |
|---|---|---|---|
| 3,798,560 | 3/1974 | Taylor | 364/724.17 |
| 4,920,507 | 4/1990 | Takeda | 364/724.17 |
| 4,972,356 | 11/1990 | Williams | 364/724.17 |

OTHER PUBLICATIONS

"A 16-bit Oversampling A-to-D Conversion Technology Using Triple-Integration Noise Shaping", *IEEE Journal of Solid-State Circuits*, vol SC-22, No. 6, Dec. 1987, by Yasuyuki Matsuya et al, pp. 921-928.
"An ISDN Echo-Cancelling Transceiver Chip Set for 2B1Qded U-Interface", *IEEE Journal of Solid-State Circuits*, vol. 24, No. 6, Dec. 1989, by Yutaka Takahashi et al. pp. 1598-1603.

*Primary Examiner*—David H. Malzahn
*Attorney, Agent, or Firm*—Young & Thompson

[57] ABSTRACT

A cascade digital filer has a plurality of cascade-connecting pairs of integrators and differentiators to realize a transfer function obtained by cascade-connecting a plurality of moving average filters. Each of the integrators includes an adder which has a two's complement operating function which inverts its polarity on overflow. Each of the differentiators also includes an adder which has the same number of bits and the same function as does the adder of integrator. The adder in each of the integrators and differentiators prevents the output of the digital filter from diverging, thus resulting in normal filtered output.

8 Claims, 4 Drawing Sheets

● REPRESENTS AN OUTPUT VALUE
OF THE ADDER

CASCADE DIGITAL FILTERS FOR REALIZING A TRANSFER FUNCTION OBTAINED BY CASCADE-CONNECTING MOVING AVERAGE FILTERS

FIELD OF THE INVENTION

The present invention relates to digital filters and, in particular, to a FIR (finite impulse response) digital filter for achieving a transfer function equivalent to one obtained by cascade-connecting one or more moving average filters.

BACKGROUND OF THE INVENTION

In general, a FIR digital filter, as shown in FIG. 1, has a non-recursive configuration comprising k one-clock delay elements D1-Dk, k+1 multipliers M1-M(k+1) for multiplication of the respective tap coefficients $b_0$-$b_{k+1}$, and an adder A1 for adding these products. The transfer function H(z) of this FIR filter is given by the following equation.

$$H(z) = \sum_{n=0}^{k} b_n \cdot Z^{-n} \quad (1)$$

In order to realize the configuration by means of hardware, a product-sum operation circuit as shown in FIG. 2 has been generally employed. In FIG. 2, the respective tap coefficients stored in a ROM (Read Only Memory) 1 and the input X are sequentially multiplied together by a multiplier 2 in accordance with the clock timing. The respective results are sequentially entered to an accumulative adder 5 comprising an adder 3 and an accumulator 4, which plays parts of the delay elements D1 to Dk and the adder A1 of FIG. 1. Thus, the transfer function as shown in equation (1) can be realized.

The filter output Y is output at each time when the accumulative adder 5 has operated (k+1) times. In other words, the output Y of the FIR filter is caused by 1/(k+1) decimation of the output of the accumulator 4. However, since this decimation frequency is two or more times as great as a frequency of the passband of this filter, there is no problem occurring in the resulting filter output.

The moving average filter is obtained by setting all the tap coefficients $b_0$-$b_{k+1}$ of the FIR filter shown in FIG. 1 to 1. In consequence, from the equation (1), the transfer function of the moving average filter can be given by the following equation.

$$H(z) = \sum_{n=0}^{k} Z^{-n} = 1 + Z^{-1} + Z^{-2} + \ldots + Z^{-k} = \frac{1 - Z^{-(k+1)}}{1 - Z^{-1}} \quad (2)$$

As seen from this equation (2), the moving average filter is a nonpolar or all-zero lowpass filter in which k zero points are assigned at equal intervals on a unit circle of the z-plane with a zero point and a pole canceling out at z=1. Such a moving average filter can be realized in the circuit of FIG. 2 by setting all the tap coefficients of the ROM 1 to 1 or by only the accumulative adder 5.

The FIR filter in which two or more moving average filters are cascade-connected has the tap coefficients each being a positive integer. In consequence, the function of the multiplier in the product-sum operation circuit can be realized by the adder so that the amount of hardware is reduced.

In particular, in the FIR filter where two moving average filters are cascade-connected, its tap coefficients can be represented by a monotone increasing or decreasing function. Assuming that the two moving average filters cascade-connected have (k+1) and (l+1) tap coefficients, respectively, its transfer function can be given by the following equation.

$$\begin{aligned} H(z) &= \sum_{n=0}^{k} Z^{-n} \cdot \sum_{m=0}^{l} Z^{-m} \\ &= (1 + Z^{-1} + Z^{-2} + \ldots + Z^{-k})(1 + Z^{-1} + Z^{-2} + \ldots + Z^{-l}) \\ &= 1 + 2Z^{-1} + 3Z^{-2} + 4Z^{-3} + \ldots + (l+1)Z^{-l} + \ldots + (l+1)Z^{-k} + \ldots + Z^{-(k+l)} \end{aligned} \quad (3)$$

As shown by this equation, the tap coefficients sequentially increase one by one up to the (l+1)th tap, become a constant value (l+1) from the (l+1)th tap up to the (k+1)th tap, and sequentially decrement one by one from the (k+1)th tap to the last tap. Therefore, in the FIR filter which realizes such a transfer function by means of hardware, it becomes possible to produce the tap coefficients by using an up/down counter in place of the ROM 1 to thereby further reduce the hardware amount.

However, in the conventional arrangement as shown in FIG. 2, if three or more moving average filters are cascade-connected to form a FIR filter, the monotoneity of the tap coefficients described above disappears. As a result, a ROM for storing the tap coefficients becomes necessary, therefore it is difficult to drastically reduce the hardware amount.

SUMMARY OF THE INVENTION

A digital filter is comprised of one or more pairs of an integrator and a differentiator which are cascade-connected, thus realizing a transfer function equivalent to one resulting from cascade-connecting at least one moving average filter.

The integrator is comprised of a first delay element and a first adder. The first adder has 2's complement operating function to change its polarity on overflow.

The differentiator is comprised of a second delay element and a second adder, the second adder having bits of the same number as the first adder and having 2's complement operating function to change its polarity on overflow, that is, the same function as that of the first adder.

A pair of the integrator and the differentiator described above permits the multiple cascade connection with the drastically reduced amount of hardware. A plurality of pairs of them which are merely cascade-connected can realize the transfer function obtained by cascade-connecting the plurality of moving average filters.

If the transfer function to be realized is equivalent to a power of the transfer function of a single moving average filter, then it becomes possible to further reduce the amount of hardware.

BRIEF DESCRIPTION OF THE ACCOMPANYING DRAWINGS

DETAILED DESCRIPTION OF THE PREFERRED EMBODIMENTS

Figure 1:
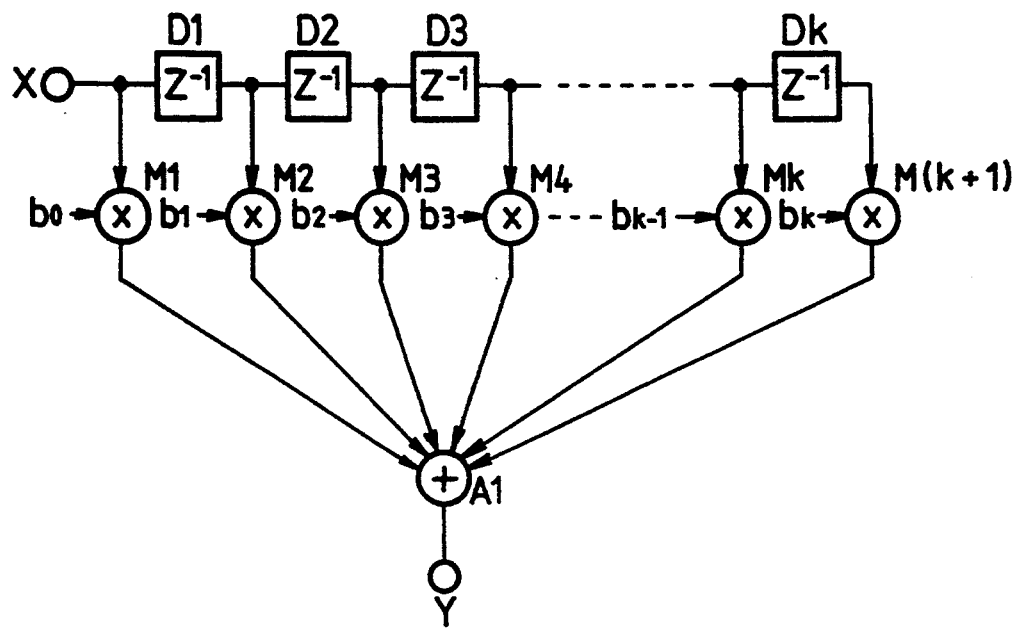
FIG. 1 is a basic block diagram for explaining a FIR digital filter.
Figure 2:
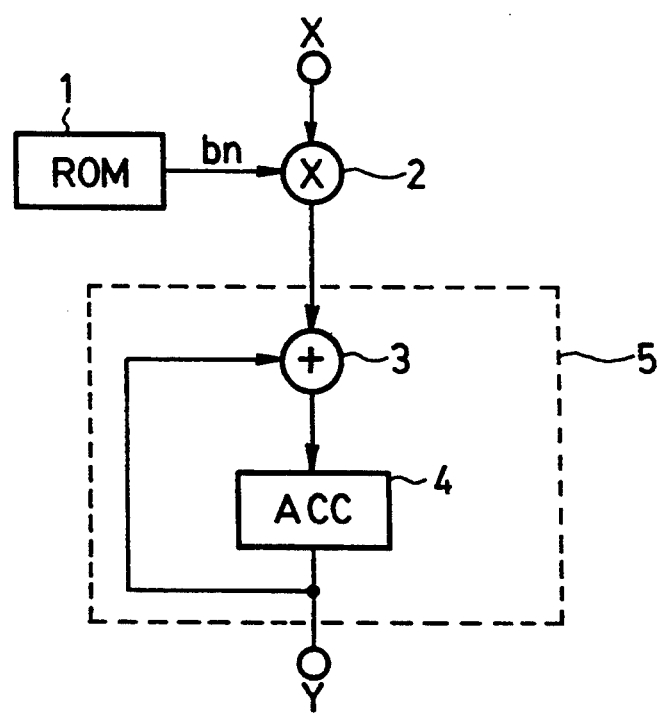
FIG. 2 is a block diagram illustrating a specific embodiment of a conventional digital filter.
Figure 3:
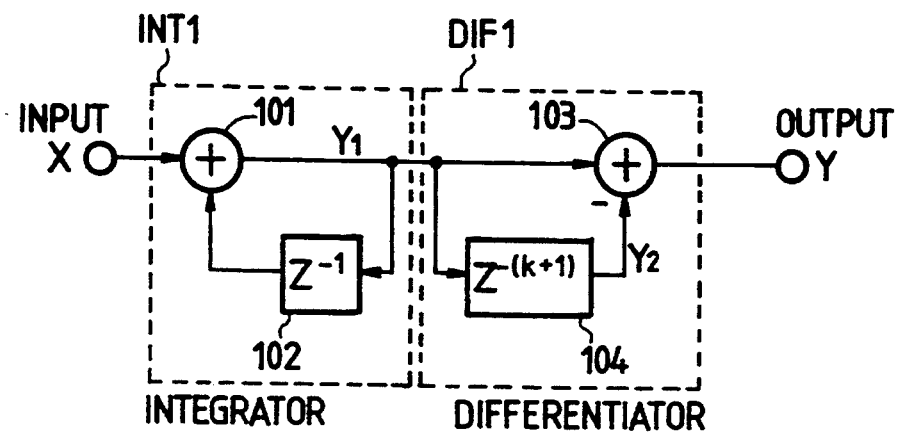
FIG. 3 is a block diagram illustrating a first embodiment of the digital filter according to the present invention.

Referring to FIG. 3, a first embodiment of the digital filter according to the present invention has an arrangement in which a digital integrator INT1 and a digital differentiator DIF1 are cascade-connected providing the transfer function equivalent to that of a moving average filter.

The integrator INT1 is comprised of an adder 101 and a 1-clock pulse delay element 102. The adder 101 receives the filter input signal X and the output signal from a delay element 102, and outputs the signal $Y_1$ which is the input of the delay element 102 as well as the output signal of the integrator INT1. The adder 101, as will be described later, has a 2's complement operating function to invert its polarity on overflow. The binary representation existing in the adder 101 is seen to be comprised of a sign digit and the 2's complement.

The differentiator DIF1 is comprised of an adder 103 and a (k+1)-clock pulse delay element 104. The adder 103 has the same number of bits and the same function as those of the adder 101. The output signal $Y_1$ from the integrator INT1 is input to the adder 103 and the delay element 104. The output signal $Y_2$ from the delay element 104 is input to the adder 103 as $-Y_2$, which outputs the filter output signal Y.

Since the transfer function of the integrator INT1 is defined by $1/(1-Z^{-1})$ and the transfer function of the differentiator DIF1 $1-Z^{-(k+1)}$, it is apparent by referring to the equation (2) that this cascade connection of the integrator INT1 and the differentiator DIF1 realizes a moving average filter.

In the arrangement in which the integrator INT1 and the differentiator DIF1 are cascade-connected, it is important that the adders 101 and 103 have the 2's complement operating function to change the polarity on overflow. Since the output of an integrator diverges in response to its DC input, it is indispensable to eliminate this effect. As that solution, in this embodiment, the adder 101 of the integrator INT1 and the adder 103 of the differentiator DIF1 have the 2's complement operating function to invert the polarity on overflow to achieve the normal filter output Y.

Figure 4:
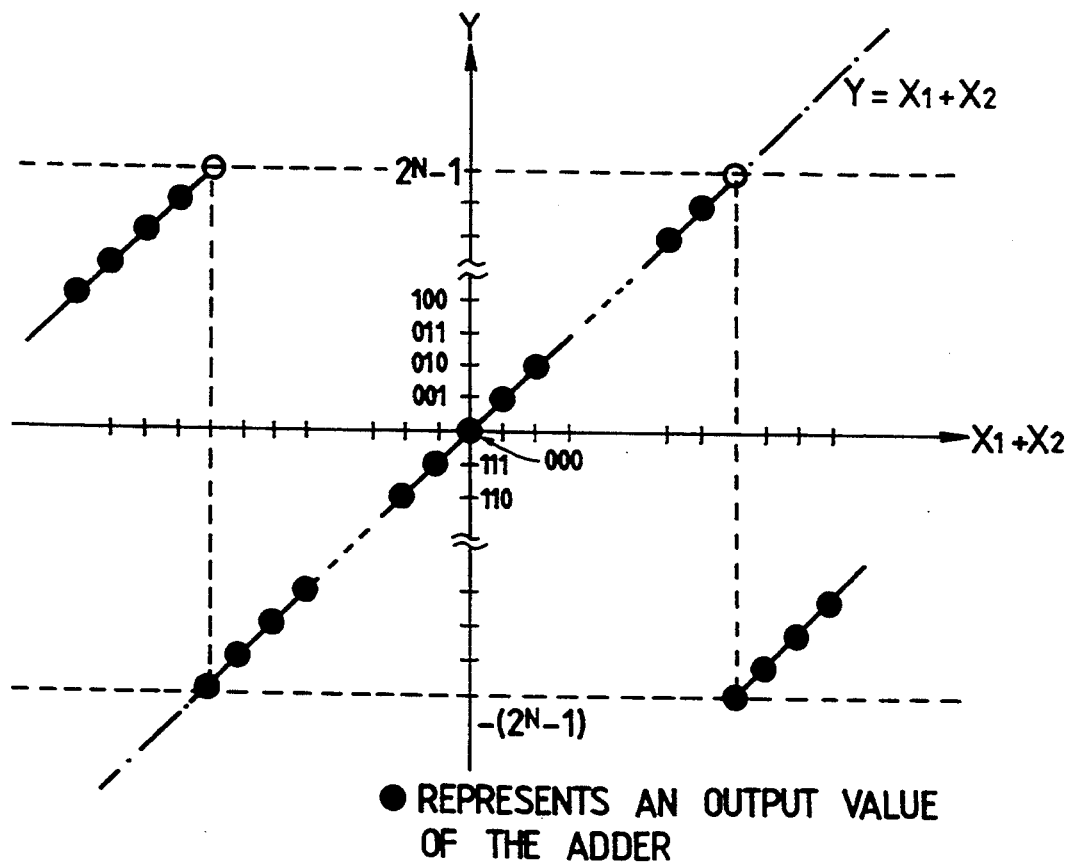
FIG. 4 is an explanatory graph of the operation of an adder in the present invention.

The inverting operation of the polarity of the adders 101 and 103 is carried out as shown in FIG. 4. In FIG. 4, the horizontal axis represents the values resulting from adding two values $X_1$ and $X_2$ entered to the adder while the vertical axis represents the output values of that adder. For example, when N=3, if the value $X_1+X_2$ is the binary representation '0111', then the output of the adder represents the numerical value +6, while if the value $X_1+X_2$ overflows with the binary representation '1000', the numerical value represented by the output of the adder is turned into −7 because the polarity of the adder is inverted.

Figure 5:
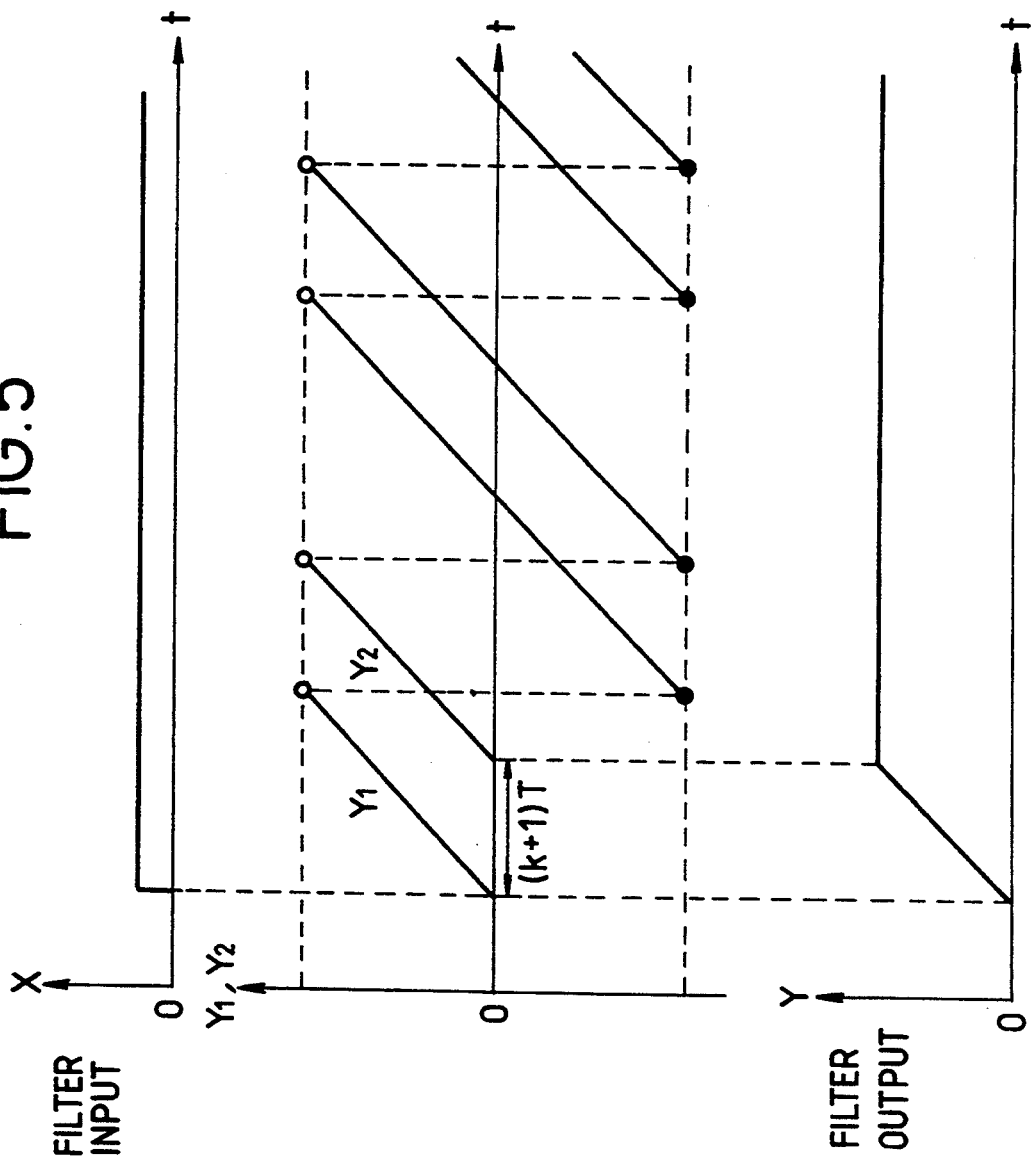
FIG. 5 is a timing chart illustrating the operation of the present invention.

Referring to the timing chart of FIG. 5, the operation of the FIR filter according to this embodiment is hereinafter described. By way of example, the filter input X is set to a step signal like a step function. When the input X rises, the output signal $Y_1$ of the integrator INT1 also starts to rise:, and is input to the adder 103 and the delay element 104 of the differentiator DIF1. The signal $Y_2$ starts to rise, as in the signal $Y_1$, delay time (k+1)T by the delay element 104 after the signal $Y_1$ starts to rise, where T denotes the clock period. Since the adder 101 or 103 is inverted in its polarity on overflow, as described above, the signals $Y_1$ and $Y_2$ generate the trajectories as indicated in FIG. 5. In consequence, the adder 103 which receives the signals $Y_1$ and $-Y_2$ emits the filter output signal Y as shown in FIG. 5. Even if the output $Y_1$ of the integrator INT1 diverges in response to the step input X, the filter output Y from the differentiator DIF remains in a normal state.

Figure 6:
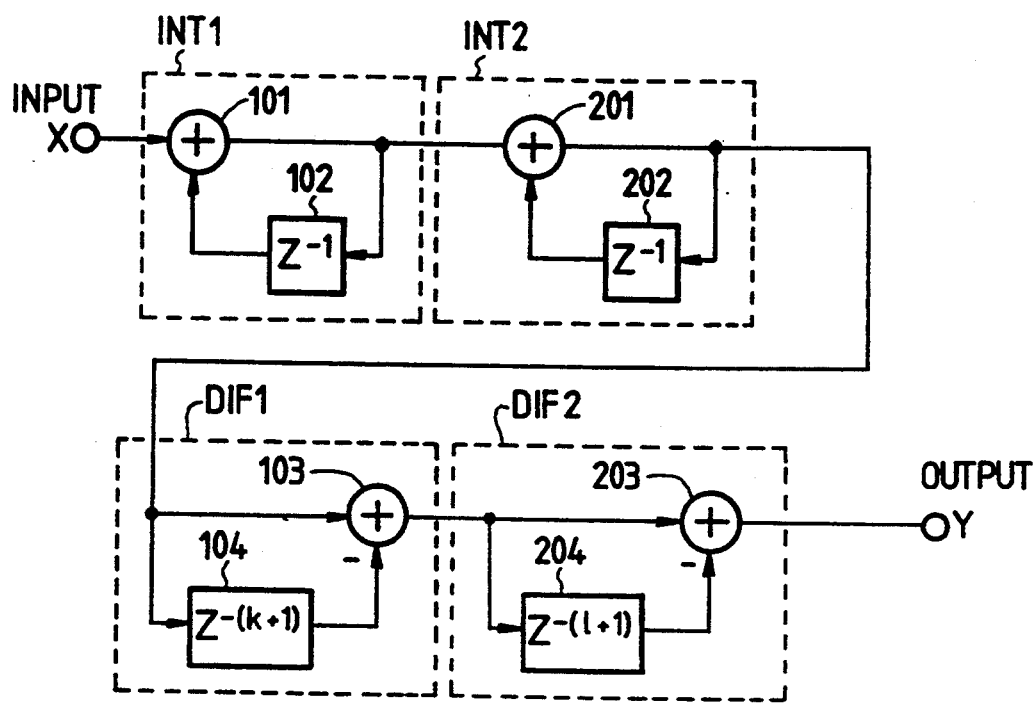
FIG. 6 is a block diagram of a second embodiment of the digital filter according to the present invention.

Referring to FIG. 6, another embodiment of the present invention has an arrangement in which integrators INT1 and INT2 and differentiators DIF1 and DIF2 are cascade-connected. The integrator INT1 and the differentiator DIF1 have the same arrangements as those of FIG. 3, respectively. The integrator INT2 is comprised of an adder 201 and a 1-clock pulse delay element 202, the adder 201 having a 2's complement operating function to change its polarity on overflow, as in the integrator INT1. The differentiator DIF2 is comprised of an adder 203 and a (l+1)-clock pulse delay element 204, the adder 203 having a 2's complement operating function to invert its polarity on overflow.

Such a digital filter is equivalent to the filter in which two moving average filters are cascade-connected: one with (k+1) taps and the other with (l+1) taps, and its transfer function is given by the following equation.

$$H(z) = \frac{1-Z^{-(k+1)}}{1-Z^{-1}} \cdot \frac{1-Z^{-(l+1)}}{1-Z^{-1}} \quad (4)$$

Figure 7:
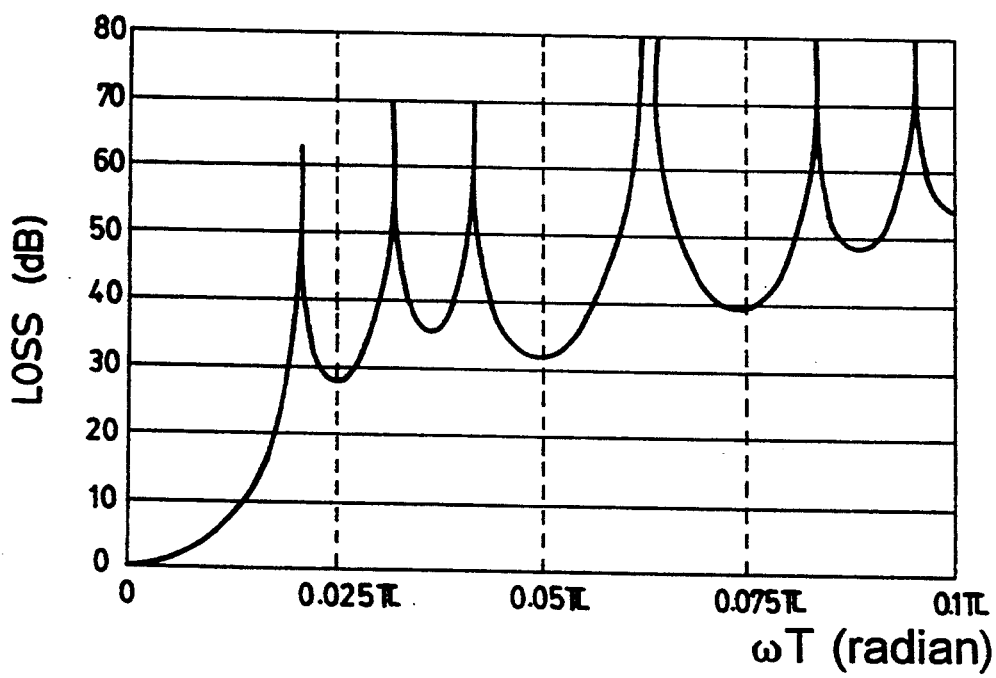
FIG. 7 is a graphic view of the frequency characteristic of the second embodiment.

In the digital filter illustrated in FIG. 6, its frequency characteristic with k=15, l=62, and the DC gain 0 dB is shown in FIG. 7.

As described above, only by additionally connecting a pair of the integrator and the differentiator to the filter as shown in FIG. 3, a digital filter equivalent to the filter in which two moving average filters are cascade-connected can readily be realized. Similarly, a digital filter where three or more moving average filters are cascade-connected can be readily realized by only cascade-connecting three or more pairs of integrators and differentiators. This can eliminate the ROM which has been necessary to store the tap coefficients.

Further, if the transfer function H(z) to be realized, as the following equation (5), is given by a power of the transfer function of a moving average filter, it becomes possible to drastically reduce the hardware amount because the delay element of the integrator can be operated in accordance with the frequency-divided clock of $1/(k+1)$ the master clock frequency.

$$H(z) = \left\{ \frac{1-Z^{-(k+1)}}{1-Z^{-1}} \right\}^N, \quad (5)$$

$$N = 1, 2, 3, \ldots$$

As described above, the digital filter according to the present invention is comprised of at least one pair of the integrator and the differentiator each having the same adder with a two's complement operating function to invert its polarity on overflow. As a result, it becomes possible to readily realize the transfer function equivalent to one resulting from cascade-connecting one or more moving average filters with a small scale hardware amount.

What is claimed is:

1. In a digital filter for realizing a transfer function obtained by cascade-connecting a plurality of moving average filters, said digital filter comprising a plurality of pairs of integrators and differentiators which are cascade-connected, each of said pairs of integrators and differentiators realizing a moving average filter transfer function, the improvement wherein:

each integrator of said pairs comprises a first adder and a first delay element, said first adder having a function to invert its polarity on overflow, said first adder adding an input signal of said integrator and an output signal of said first delay element, said first delay element delaying the output signal of said first adder, and each differentiator of said pairs comprises a second adder and a second delay element, said second adder having a same number of bits as said first adder and having a function to invert its polarity on overflow, said second adder adding an input signal of said differentiator and a negative output signal of said second delay element, said second delay element delaying the input signal of said differentiator.

2. The improvement as set forth in claim 1 wherein each of said first and second adders has a two's complement operating function which inverts its polarity on overflow.

3. In a digital filter for realizing a transfer function obtained by cascade-connecting three or more moving average filters, said digital filter comprising three or more pairs of integrators and differentiators which are cascade-connected, each of said pairs of integrators and differentiators realizing a moving average filter transfer function, the improvement wherein:

each integrator of said pairs comprises a first adder and a first delay element, said first adder having a function to invert its polarity on overflow, said first adder adding an input signal of said integrator and an output signal of said first delay element, said first delay element delaying the output signal of said first adder, and each differentiator of said pairs comprises a second adder and a second delay element, said second adder having a same number of bits as said first adder and having a function to invert its polarity on overflow, said second adder adding an input signal of said differentiator and a negative output signal of said second delay element, said second delay element delaying the input signal of said differentiator.

4. The improvement as set forth in claim 3, wherein each of said first and second adders has a two's complement operating function which inverts its polarity on overflow.

5. In a digital filter for realizing a transfer function obtained by cascade-connecting a plurality of moving average filters, said transfer function being a power of a transfer function of a moving average filter, said digital filter comprising a plurality of pairs of integrators and differentiators which are cascade-connected, each of said pairs of integrators and differentiators realizing said transfer function of said moving average filter, the improvement wherein:

each integrator of said pairs comprises a first adder and a first delay element, said first adder having a function to invert its polarity on overflow, said first adder adding an input signal of said integrator and an output signal of said first delay element, said first delay element delaying the output signal of said first adder, and each differentiator of said pairs comprises a second adder and a second delay element, said second adder having a same number of bits as said first adder and having a function to invert its polarity on overflow, said second adder adding an input signal of said differentiator and a negative output signal of said second delay element, said second delay element delaying the input signal of said differentiator.

6. The improvement as set forth in claim 5, wherein each of said first and second adders has a two's complement operating function which inverts its polarity on overflow.

7. In a digital filter for realizing a transfer function obtained by cascade-connecting a plurality of moving average filters, said digital filter comprising a plurality of pairs of first circuits and second circuits which are cascade-connected, each of said pairs of said first circuits and said second circuits realizing a transfer function of a moving average filter, the improvement wherein:

each first circuit of said pairs comprises first adding means and first delay means, said first adding means having a function to invert its polarity on overflow, said first adding means adding an input signal of said first circuit and an output signal of said first delay means, said first delay means delaying the output signal of said first adding means by one delay, and each second circuit of said pairs comprises second adding means and second delay means, said second adding means having a same number of bits as said first adding means and having a function to invert its polarity on overflow, said second adding means adding an input signal of said second circuit and a negative output signal of said second delay means, said second delay means delaying the input signal of said second circuit by a predetermined delay.

8. The improvement as set forth in claim 7, wherein each of said first adding means and said second adding means has a two's complement operating function which inverts its polarity on overflow.

* * * * *